(12) United States Patent
Lyons et al.

(10) Patent No.: US 11,658,004 B2
(45) Date of Patent: *May 23, 2023

(54) METHOD FOR SCANNING A SAMPLE BY A CHARGED PARTICLE BEAM SYSTEM

(71) Applicant: ASML Netherlands B.V., Veldhoven (NL)

(72) Inventors: Adam Lyons, Albany, NY (US); Thomas I. Wallow, San Carlos, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/480,032

(22) Filed: Sep. 20, 2021

(65) Prior Publication Data

US 2022/0084784 A1  Mar. 17, 2022

Related U.S. Application Data

(63) Continuation of application No. 16/730,875, filed on Dec. 30, 2019, now Pat. No. 11,127,563.

(Continued)

(51) Int. Cl.
*H01J 37/28* (2006.01)
*H01J 37/04* (2006.01)
(Continued)

(52) U.S. Cl.
CPC .............. *H01J 37/28* (2013.01); *G01N 23/06* (2013.01); *G01N 23/203* (2013.01);
(Continued)

(58) Field of Classification Search
CPC ...... H01J 37/28; H01J 37/045; H01J 37/1474; G01N 23/06; G01N 23/203; G01N 23/2251
See application file for complete search history.

(56) References Cited

U.S. PATENT DOCUMENTS

| 5,977,542 A | 11/1999 | Singh et al. |
| 6,107,636 A | 8/2000 | Muraki |

(Continued)

FOREIGN PATENT DOCUMENTS

| JP | S6243052 A | 2/1987 |
| JP | 2007059370 A | 3/2007 |

(Continued)

OTHER PUBLICATIONS

Notice of Reasons for Rejection from the Japan Patent Office issued in related Japanese Patent Application No. 2021-532826; dated Jun. 30, 2022 (6 pgs.).

(Continued)

*Primary Examiner* — Sean M Luck
(74) *Attorney, Agent, or Firm* — Finnegan, Henderson, Farabow, Garrett & Dunner, LLP

(57) ABSTRACT

A method for scanning a sample by a charged particle beam tool is provided. The method includes providing the sample having a scanning area including a plurality of unit areas, scanning a unit area of the plurality of unit areas, blanking a next unit area of the plurality of unit areas adjacent to the scanned unit area, and performing the scanning and the blanking the plurality of unit areas until all of the unit areas are scanned.

18 Claims, 12 Drawing Sheets

Related U.S. Application Data

(60) Provisional application No. 62/943,695, filed on Dec. 4, 2019, provisional application No. 62/787,121, filed on Dec. 31, 2018.

(51) Int. Cl.
  *H01J 37/147* (2006.01)
  *G01N 23/06* (2018.01)
  *G01N 23/203* (2006.01)
  *G01N 23/2251* (2018.01)

(52) U.S. Cl.
  CPC ........ *G01N 23/2251* (2013.01); *H01J 37/045* (2013.01); *H01J 37/1474* (2013.01)

(56) References Cited

U.S. PATENT DOCUMENTS

| | | |
|---|---|---|
| 6,744,058 B1 | 6/2004 | Gau et al. |
| 7,817,105 B2 | 10/2010 | Kobaru et al. |
| 9,495,499 B2 | 11/2016 | Platzgummer |
| 2007/0159662 A1 | 7/2007 | Kobaru et al. |
| 2009/0152461 A1 | 6/2009 | Kim |
| 2010/0327160 A1 | 12/2010 | Zhao |
| 2012/0126136 A1 | 5/2012 | Ito |
| 2012/0288787 A1 | 11/2012 | Choi |
| 2014/0042334 A1 | 2/2014 | Wieland |

FOREIGN PATENT DOCUMENTS

| | | |
|---|---|---|
| TW | 436915 | 5/2001 |
| TW | I613524 | 2/2018 |
| TW | I634581 | 9/2018 |

OTHER PUBLICATIONS

Office Action of the Intellectual Property Office of Taiwan issued in related Taiwanese Patent Application No. 108147155, dated Nov. 18, 2020 (5 pgs.).

International Search Report issued in related PCT International Application No. PCT/EP2019/08684, dated Apr. 20, 2020 (3 pgs.).

Notification of Reasons for Refusal from the Korean Patent Office issued in related Korean Patent Application No. 10-2021-7020569; dated Feb. 28, 2023 (13 pgs.).

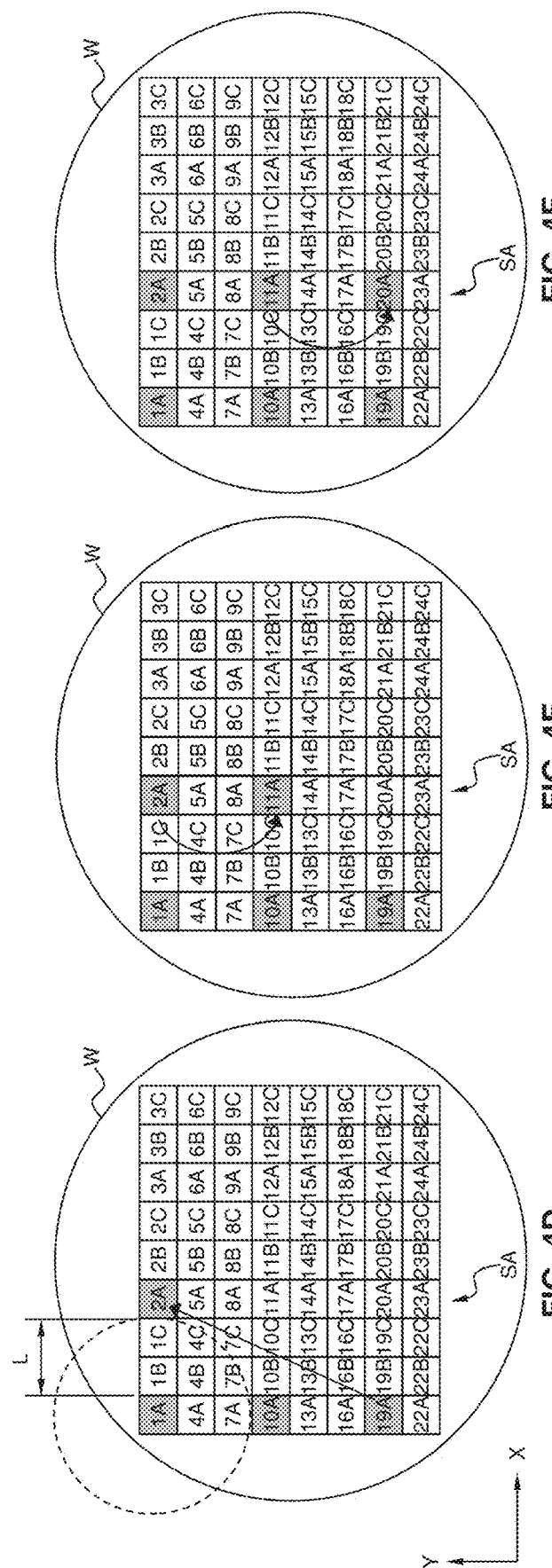

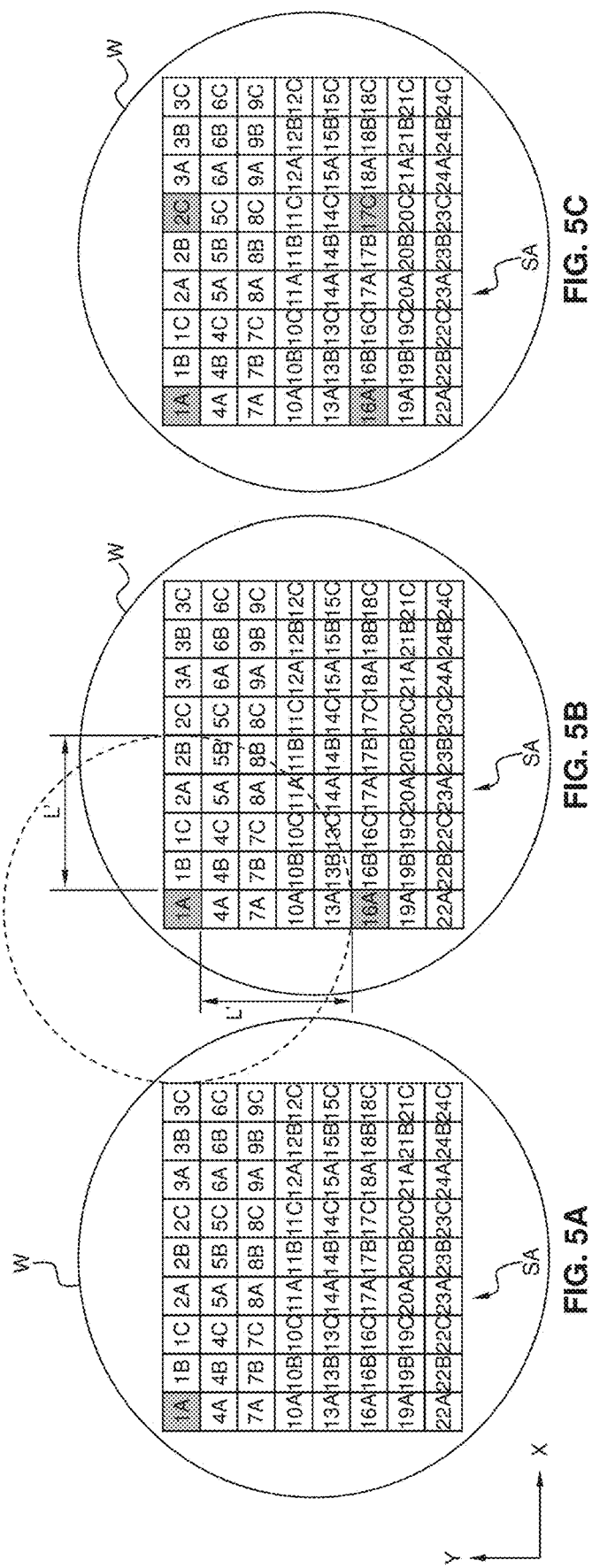

METHOD FOR SCANNING A SAMPLE BY A CHARGED PARTICLE BEAM SYSTEM

CROSS-REFERENCE TO RELATED APPLICATIONS

This application is a continuation of application Ser. No. 16/730,875 filed Dec. 30, 2019, which claims priority of U.S. application 62/787,121 which was filed on Dec. 31, 2018, and U.S. application 62/943,695 which was filed on Dec. 4, 2019, all of which are incorporated herein by reference in their entireties.

FIELD

Apparatuses and methods consistent with the present disclosure relate generally to a scanning technique, and more particularly, to methods and systems for scanning a sample by a charged particle beam tool such as a scanning electron microscope (SEM).

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a SEM, can be employed. For inspection of fine structures, electron beam is preferred. Using electron beam for such inspection of a sample imposes a problem of charge accumulation in the sample. To solve the charge accumulation problem, technicians usually would sputter highly conductive material or thin film, such as gold thin film of a few nanometer thick, onto the sample surface for conducting the charge away from the scanned region of the sample. However, this approach would damage the originally designed device structure and would not allow the sample to be used as a device because the blanket-coated gold layer would short all circuits formed on the sample. Further improvements in the art are desired.

SUMMARY

According to some embodiments of the present disclosure, there is provided a method for scanning a sample by a charged particle beam tool, such as an electron beam tool. The method may comprise: providing the sample having a scanning area, wherein the sample is determined to have a plurality of unit areas; scanning a unit area of the plurality of unit areas; and blanking a first unit area adjacent to the scanned unit area.

The method may further comprise: determining whether any unit area on the sample remains to be scanned; in response to the determination that any unit area on the sample remains to be scanned, scanning a next unit area that is determined to be outside of a determined dissipation region associated with the scanned unit area; and blanking a second unit area adjacent to the scanned next unit area. The method may further comprise: blanking a third unit area adjacent to the blanked first unit area before scanning the next unit area. In the method, the blanked first unit area may include multiple unit areas.

In the method, the first blanked unit area may be adjacent to the scanned unit area in the X-direction. In the method, the first blanked unit area may be adjacent to the scanned unit area in the Y-direction. In the method, the scanned unit area may be a single pixel of a scanned image. In the method, the first blanked unit area may be a single pixel. In the method, the first blanked unit area may be multiple pixels. In the method, the scanned unit area may be a plurality of pixels of a scanned image.

In the method, blanking a first unit area adjacent to the scanned unit area may further comprise: applying a current to an electromagnetic blanker so that an electromagnetic field generated by the blanker deflects an electron beam of the electron beam tool such that the electron beam no longer reaches the sample.

In the method, blanking a first unit area adjacent to the scanned unit area may further comprise: moving a shutter to intercept a pathway of an electron beam of the electron beam tool such that the electron beam no longer reaches the sample. In the method, the scanning and the blanking may be determined based on a dissipation time for charge dissipation in the scanned unit area. In the method, the scanning and the blanking may be carried out on a predetermined pattern in the sample.

In the method, the predetermined pattern may be one of a line pattern parallel to the edges of the scanning area, a line pattern diagonal in the scanning area, or a circular pattern. In the method, the scanning and the blanking may be performed on the plurality of unit areas until all unit areas are scanned.

The method may further comprise: reconstructing an image of the sample using sub-images corresponding to the plurality of unit areas that have been scanned. In the method, the reconstructing may be performed by using at least one of interpolation, sparse sampling, or simulation. In the method, the plurality of unit areas of a scanning area may be organized in batches of unit areas provided in rows or columns and the scanned unit area and the blanked unit area may be in a first batch of unit areas.

In the method, after scanning and blanking unit areas in the first batch: blanking or skipping a second batch of unit areas that is adjacent to the first batch; and scanning and blanking unit areas in a third batch of unit areas that is at least a threshold distance from the first batch to mitigate charge induced distortion from scanned unit areas of the first batch. The method may further comprise: after a dissipation time threshold, returning to the first batch of unit areas to scan unit areas that have not been previously scanned to mitigate charge induced distortion from previously scanned unit areas of the first batch.

According to some embodiments of the present disclosure, there is provided a scanning electron microscope (SEM). The SEM may comprise: an electron source; a scanning deflector to scan an electron beam emitted from the electron source on a scanning area of a sample, wherein the sample is determined to have a plurality of unit areas; a blanker for blanking the electron beam such that the electron beam no longer reaches the sample; and a controller includes circuitry for controlling the scanning deflector and the blanker, wherein the controller is configured to scan a unit area of the plurality of unit areas; and blank a first unit area adjacent to the scanned unit area.

In the SEM, the controller may further configured to: determine whether any unit area on the sample remains to be scanned; in response to the determination that any unit area on the sample remains to be scanned, scan a next unit area that is determined to be outside of a determined dissipation region associated with the scanned unit area; and blank a second unit area adjacent to the scanned next unit area.

In the SEM, the controller may be further configured to: blank a third unit area adjacent to the blanked first unit area before scanning the next unit area. In the SEM, the blanked first unit area includes multiple unit areas. In the SEM, the first blanked unit area may be adjacent to the scanned unit area in the X-direction. In the SEM, the first blanked unit area may be adjacent to the scanned unit area in the Y-direction. In the SEM, the scanned unit area may be a single pixel of a scanned image. In the SEM, the first blanked unit area may be a single pixel. In the SEM, the first blanked unit area may be multiple pixels. In the SEM, the scanned unit area may be a plurality of pixels of a scanned image.

In the SEM, the blanker may be an electromagnetic blanker to which a current is applied so as to induce an electromagnetic field that deflects the electron beam of the SEM such that the electron beam no longer reaches the sample. In the SEM, the blanker may be a shutter configured to intercept a pathway of the electron beam of the SEM so as to perform the blanking. In the SEM, the blanker may blank for a time determined based on a dissipation time for charge dissipation.

In the SEM, the controller may include circuitry to determine a next unit area to scan, wherein the next unit area is at least a threshold distance from the scanned unit area and is selected to mitigate a charge induced distortion from the scanned unit area such that the blanked unit area separates the scanned unit area from the next unit area. In the SEM, the blanker may be configured to blank a predetermined pattern in the sample comprising any one of a line pattern parallel to edges of the scanning area, a line pattern diagonal in the scanning area to a direction, a circular pattern, or a random pattern. In the SEM, the blanker may be positioned between the electron source and the scanning deflector.

According to some embodiments of the present disclosure, there is provided a non-transitory computer readable medium that stores a set of instructions that is executable by at least one processor of a computer system to cause the computer system to perform a method for service processing, the method comprising: providing a sample having a scanning area, wherein the sample is determined to have a plurality of unit areas; scanning a unit area of the plurality of unit areas; and blanking a unit area adjacent to the scanned unit area.

In the non-transitory computer readable medium, the set of instructions that is executable by the at least one processor of a computer system to cause the computer system to further perform: determining whether any unit area on the sample remains to be scanned; in response to the determination that any unit area on the sample remains to be scanned, scanning a next unit area that is determined to be outside of a determined dissipation region associated with the scanned unit area; and blanking a unit area adjacent to the next unit area. In the non-transitory computer readable medium, wherein the scanned unit area is a single pixel or a plurality of pixels of a scanned image before a next unit area is scanned.

According to some embodiments of the present disclosure, there is provided a method for scanning a sample with a scanning electron microscope (SEM). The method may comprise:

scanning a first set of locations with the SEM, each location of the first set of locations being physically separated by at least a threshold distance; and scanning a second set of locations with the SEM a period of time after scanning the first set of locations, a location of the second set of locations being located within the threshold distance of a location of the first set of locations. In the method, the period of time enables charge resulted from the scanning the first set of locations to dissipate sufficiently so as to mitigate a charge induced distortion of a scan of a location within the threshold distance. In the method, each of the first set of locations may be arranged in diagonal to each other. In the method, each of the second set of locations may be arranged in diagonal to each other.

BRIEF DESCRIPTION OF FIGURES

FIGS. 4A-4L are schematic diagrams illustrating top plan views of the reference sample of FIG. 3 undergoing an exemplary scanning process performed by the exemplary electron beam tool of FIG. 2, consistent with some embodiments of the present disclosure.

FIGS. 5A-5C are schematic diagrams illustrating top plan views of the reference sample of FIG. 3 undergoing another exemplary scanning process performed by the exemplary electron beam tool of FIG. 2, consistent with some embodiments of the present disclosure.

DETAILED DESCRIPTION

Figure 1:
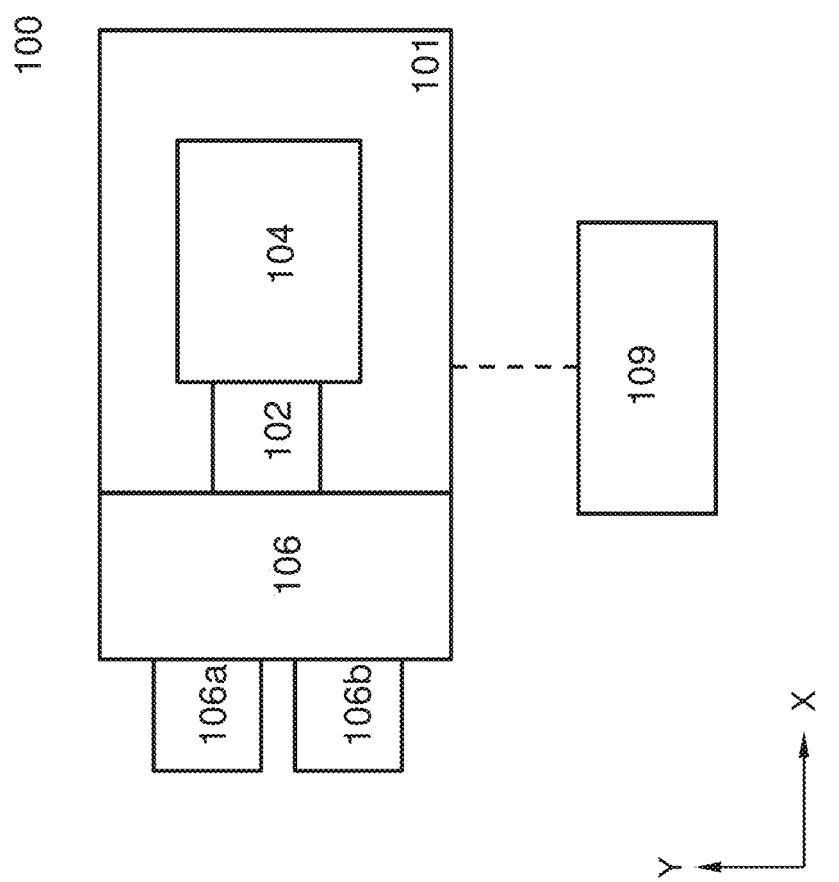
FIG. 1 is a schematic diagram illustrating an exemplary electron beam inspection (EBI) system, consistent with some embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. For example, although some embodiments are described in the context of utilizing scanning electron microscope (SEM) for generation of a wafer image and defect detection, the disclosure is not so limited. Other types of microscopes such as transmission electron microscope (TEM) and scanning tunneling microscope (STM) be similarly applied.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which is the size of a thumbnail) may include over 2 billion transistors, the size of each transistor being less than $1/1000^{th}$ of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

In various steps of the semiconductor manufacturing process, pattern defects can appear on at least one of a wafer, a chip, or a mask, which can cause a manufactured semiconductor device to fail, thereby reducing the yield to a great degree. As semiconductor device sizes continually become smaller and smaller (along with any defects), identifying defects becomes more challenging and costly. Currently, engineers in semiconductor manufacturing lines usually spend hours (and even sometimes days) to identify locations of small detects to minimize their impact on the final product.

Conventional optical inspection techniques are ineffective in inspecting small defects (e.g., nanometer scale defects). Advanced electron-beam inspection (EBI) tools, such as a scanning electron microscope (SEM) with high resolution and large depth-of-focus, have been developed to meet the need in the semiconductor industry. While SEM plays an important role in small defect detection for semiconductor wafers, using the electron beam for inspecting the semiconductor wafer involves depositing a charge on the sample (e.g. sample W in FIG. 3) at a specific location (such as a unit area (or pixel) on the sample), e.g. pixel 1A. This charge, however, can affect the imaging of subsequent adjacent pixels, e.g. pixels 1B and 1C, leading to a distortion in the imaging of the wafer W. Accordingly, this distortion can reduce the accuracy of the image, which can impact the ability to detect and analyze features on the image.

For example, as an e-beam scans across a sample (e.g., from left to right), charge begins to build up on the surface (e.g., on the surface of the sample or on the surface of a feature on the sample) on which the e-beam lands: As the charge builds up, an electric field also builds up, affecting the-trajectories of electrons that are emitted from the sample (e.g., secondary electrons, backscattered electron, etc.). This change in the trajectories of the emitted electrons affects the number of emitted electrons that are detected by a detector, resulting in a lower quality and less accurate SEM image. For example, charge can build up on a first pixel that is scanned, and the resulting electric field can affect electrons emitted from an adjacent pixel when the adjacent pixel is scanned, resulting in fewer electrons emitted from the adjacent pixel reaching a detector, and further resulting in a lower quality and less accurate image of the adjacent pixel.

The accumulated charge eventually dissipates; that is, the accumulated charge is conducted away from the scanned pixel after a sufficient amount of time. For example, in FIG. 3, pixels 1A to 3C appear in a row on a sample. Some embodiments of the present disclosure take this dissipation effect into account and provide a procedure to scan a unit area of the sample, e.g. pixel 1A of sample W in FIG. 3, and blank a unit area, e.g. pixel 1B, adjacent to the scanned unit area, e.g. pixel 1A. The blanked unit area 1B has a distance that falls within the charged area from the scanning of unit area IA, accordingly that unit area 1B is not scanned at this time. Instead of scanning unit area 1B, a unit area outside of the charged area (e.g., unit area 1C) is scanned so that the dissipating charge would not affect the scanning. After the first round of scanning the sample, some pixels, e.g. pixels 1A and 1C, are scanned and some pixels, e.g. pixels 1B and 2A, are blanked. Then, in the subsequent scanning, the blanked pixels are scanned after charges associated with scanned pixels 1A and 1C have dissipated. Comparing with the conventional SEM continuous scanning, some of the disclosed embodiments are capable of generating improved accuracy results and information for examining the sample for fine structure and nanometer scale defects during production of high density integrated electronic devices such as computer processor, memory, and high-resolution sensor device such as digital camera sensor.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

Reference is now made to FIG. 1, a schematic diagram illustrating an exemplary electron beam inspection system, consistent with some embodiments of the present disclosure. As shown in FIG. 1, electron beam inspection system 100 includes a main chamber 101, a load/lock chamber 102, an electron beam tool 104, an equipment front end module 106, and a user interface 109. Electron beam tool 104 is located within main chamber 101. Equipment front end module 106 includes a first loading port 106a and a second loading port 106b. Equipment front end module 106 may include additional loading port(s). First loading port 106a and second loading port 106b receive wafer cassettes that contain wafers (e.g., semiconductor wafers or wafers made of other material (s)) or samples to be inspected (wafers and samples are collectively referred to as "wafers" hereafter). One or more robot arms (not shown) in equipment front end module 106 transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robot arms (not shown) transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104 which is controlled by a user using the user interface 109.

Figure 2:
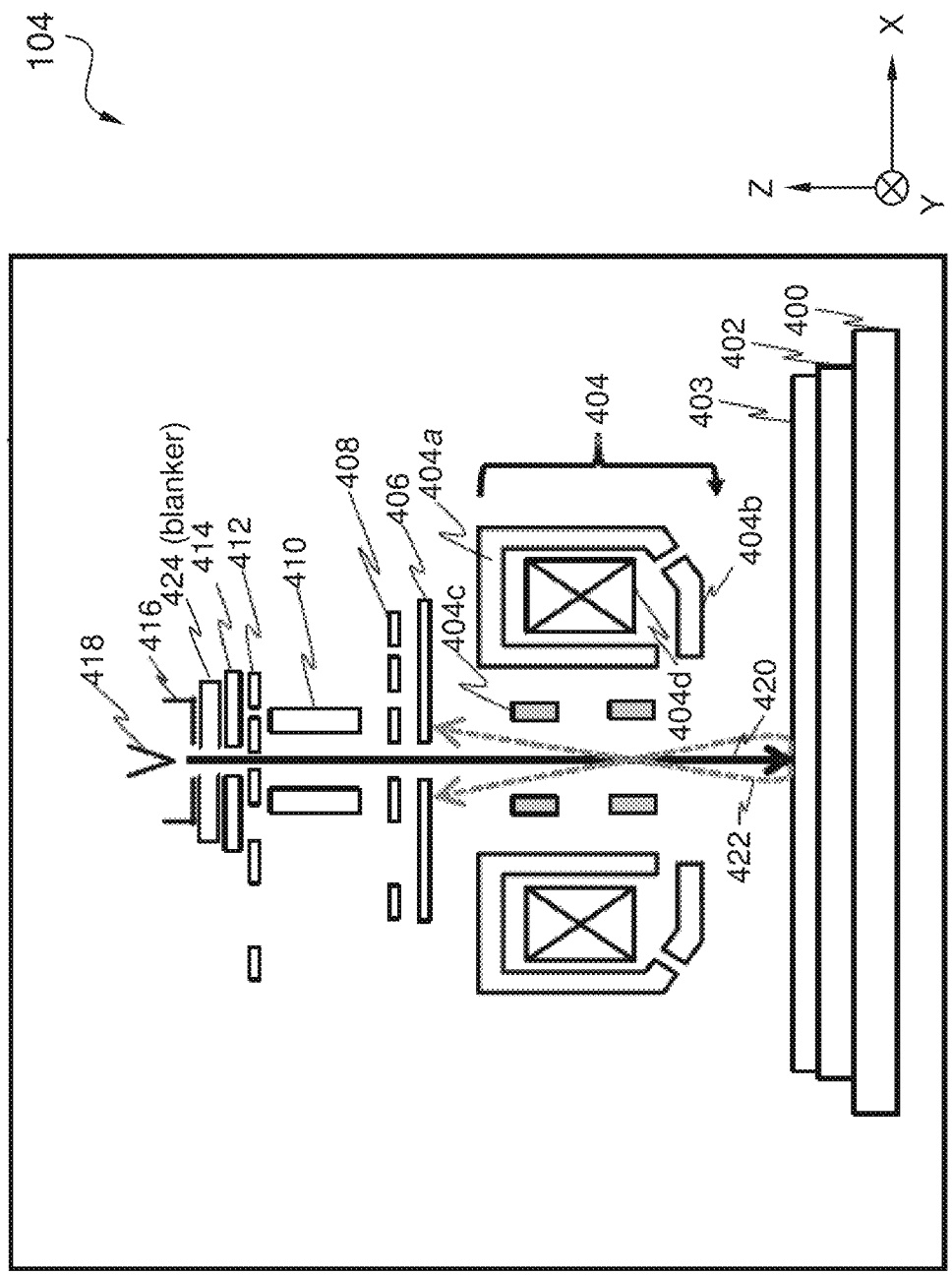
FIG. 2 is a schematic diagram illustrating an exemplary electron beam tool that can be a part of the exemplary electron beam inspection (EBI) system of FIG. 1, consistent with some embodiments of the present disclosure.

References are now made to FIG. 2, a schematic diagram illustrating an exemplary electron beam tool that can be a part of the exemplary electron beam tool 104 of FIG. 1, consistent with some embodiments of the present disclosure. As shown in FIG. 2, electron beam tool 104 includes a motorized stage 400, and a wafer holder 402 supported by motorized stage 400 to hold a wafer 403 to be inspected. Wafer 403 may be referred to as a sample. Electron beam tool 104 further includes an objective lens assembly 404, electron detector 406 (which includes electron sensor surfaces), an objective aperture 408, a condenser lens 410, a beam limit aperture 412, a gun aperture 414, a blanker 424, an anode 416, and a cathode 418. Objective lens assembly 404, in some embodiments, can include a modified swing objective retarding immersion lens (SORIL), which includes a pole piece 404a, a control electrode 404b, a deflector 404c, and an exciting coil 404d. Electron beam tool 104 may additionally include an energy dispersive X-ray spectrometer (EDS) detector (not shown) to characterize the materials on the wafer.

A primary electron beam 420 is emitted from cathode 418 by applying a voltage between anode 416 and cathode 418. Primary electron beam 420 passes through blanker 424, then passes through gun aperture 414 and beam limit aperture 412, both of gun aperture 414 and beam limit aperture 412 can determine the size of electron beam entering condenser lens 410, which resides below beam limit aperture 412. Position of blanker 424 in electron beam tool 104 can be at any position between beam limit aperture 412 and sample wafer 403, depending on the need for specific measurements.

Blanker 424 may be a shutter, an electromagnetic deflector, or a pure electrostatic deflector, among others. The shutter is mechanically moved or controlled by an electromagnetic field generated by e.g. electric current carrying coils to intercept primary electron beam 420 so that primary electron beam 420 cannot pass through blanker 424 and reach sample wafer 403, in some embodiments. The electromagnetic deflector controls the deflection of primary electron beam 420 such that the electron beam 420 no longer reaches sample wafer 403 using a magnetic field generated by permanent magnet or electromagnet, in some embodiments. The pure electrostatic deflector controls the deflection of primary electron beam 420 such that the electron beam 420 no longer reaches sample wafer 403 using an electric field generated by opposite plates carrying opposite charges, in some embodiments.

Condenser lens 410 focuses primary electron beam 420 before the beam enters objective aperture 408 to set the size of primary electron beam 420 before entering objective lens assembly 404. Deflector 404c deflects primary electron beam 420 to facilitate beam scanning on the wafer 403. For example, in a scanning process, deflector 404c can be controlled to deflect primary electron beam 420 sequentially onto different locations of top surface of wafer 403 at different time points, to provide data for image reconstruction for different parts of wafer 403. Moreover, deflector 404c can also he controlled to deflect primary electron beam 420 onto different sides of wafer 403 at a particular location, at different time points, to provide data for stereo image reconstruction of the wafer structure at that location. Further, in some embodiments, anode 416 and cathode 418 may be configured to generate multiple primary electron beams 420, and electron beam tool 104 may include a plurality of deflectors 404c to project the multiple primary electron beams 420 to different parts/sides of wafer 403 at the same time, to provide data for image reconstruction for different parts of wafer 203.

Exciting coil 404d and pole piece 404a generate a magnetic field that begins at one end of pole piece 404a and terminates at the other end of pole piece 404a. A part of wafer 403 being scanned by primary electron beam 420 can be immersed in the magnetic field and can be electrically charged, which, in turn, creates an electric field. The electric field reduces the energy of impinging primary electron beam 420 near the surface of wafer 403 before it collides with wafer 403. Control electrode 404b, being electrically isolated from pole piece 404a, controls an electric field on wafer 403 to prevent micro-arching of wafer 403 and to ensure proper beam focus.

A secondary electron beam 422 can be emitted from the part of wafer 403 upon receiving primary electron beam 420. Secondary electron beam 422 can form a beam spot on a surface of a sensor of electron detector 406. Electron detector 406 can generate a signal (e.g., a voltage, a current, etc.) that represents an intensity of the beam spot and provide the signal to a processing system (not shown). The intensity of secondary electron beam 422, and the resultant beam spot, can vary according to the external or internal structure of wafer 403. Moreover, as discussed above, primary electron beam 420 can be projected onto different locations of the top surface of wafer 403 to generate secondary electron beams 422 (and the resultant beam spot) of different intensities. Therefore, by mapping the intensities of the beam spots with the locations of wafer 403, the processing system can reconstruct an image that reflects the internal or external structures of wafer 403. Once a wafer image is acquired by electron beam tool 104, the wafer image may be transmitted to computer system (not shown).

Figure 3:
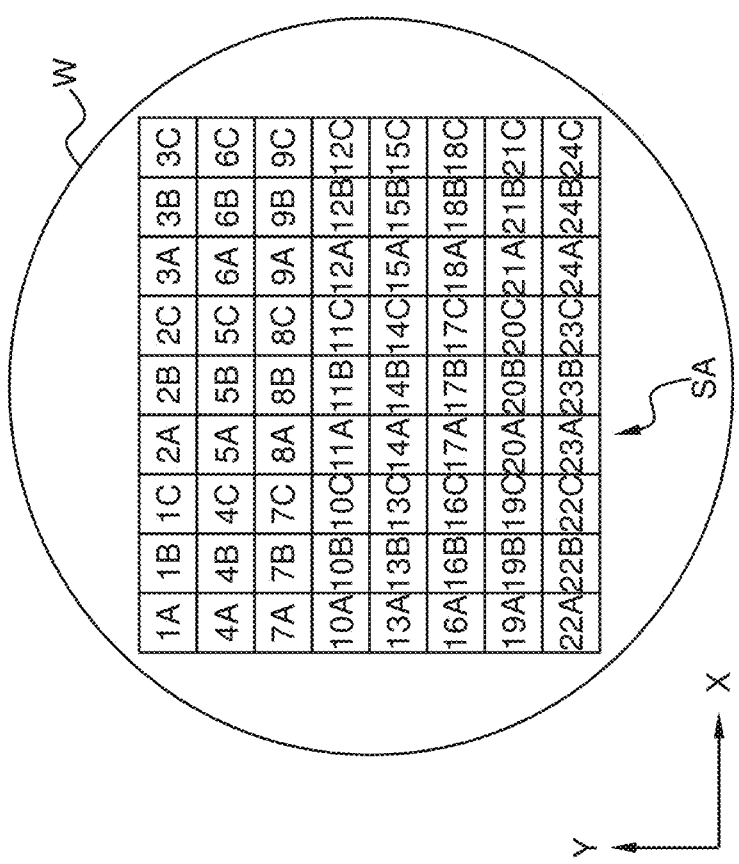
FIG. 3 is a schematic diagram illustrating a top plan view of a reference sample with a rectangular scanning grid, consistent with some embodiments of the present disclosure.

FIG. 3 is a schematic diagram illustrating a top plan view of a reference sample with a rectangular scanning grid, consistent with some embodiments of the present disclosure. In FIG. 3, in the top surface of the sample wafer W, a scanning area SA of the exemplary SEM of FIG. 2 is a rectangular grid of scanning pattern of the exemplary SEM of FIG. 2 is shown. The rectangular grid shown in FIG. 3 is an 8×9 matrix rectangular grid having 8 rows and 9 columns of unit areas. The unit areas or pixels may cover a portion of a die or dies, and are designed for scanning and blanking purpose. Each of the unit areas or pixels has an exemplary area of 1 nm×1 nm. Each of the unit areas is labelled with a number and an alphabet, e.g. the unit area located at row 1 and column 1 is labelled 1A. The unit area located at row 8 and column 9 is labelled 24C. In this manner, all unit areas in the grid are labelled for convenience of describing the scanning pattern of the SEM. In other embodiments, the grid can be an m×n matrix rectangular grid, where m and n are natural numbers. Also, the shape of the grid can be rectangle, square, circle, ellipse, pentagon, hexagon, or any polygon. For a better coverage of the circular disc shaped sample W, the grid can have a circular shape. For explaining the scanning, a rectangular grid SA is used.

Figure 4A:
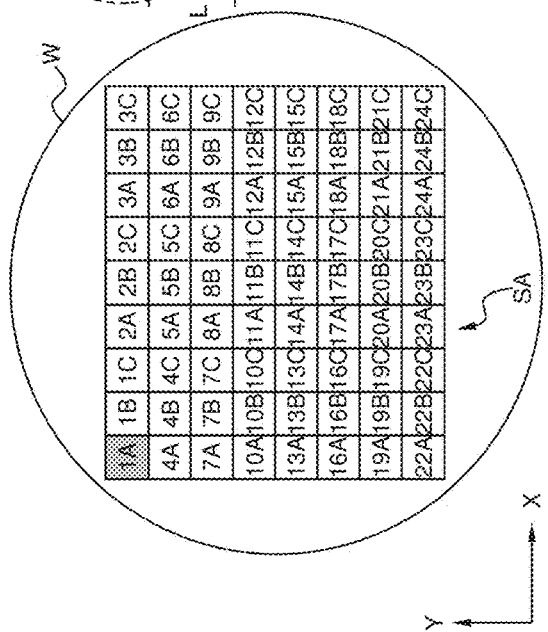
Figure 4B:
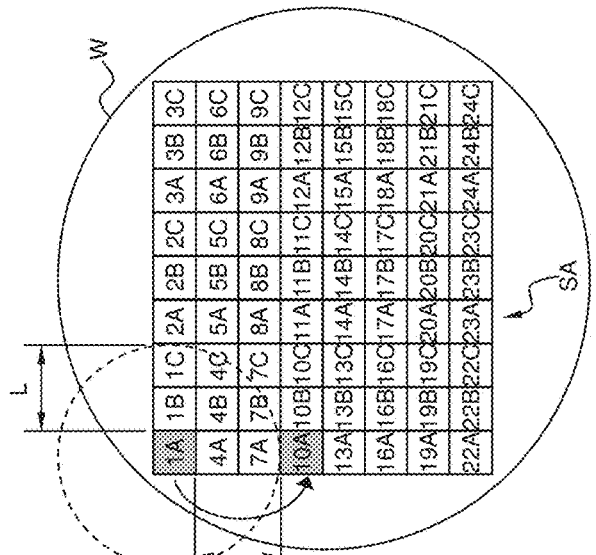

In FIG. 4A, during scanning the sample W, the SEM emits an electron beam that interacts with the first unit area 1A of the scanning area or grid SA. During this scanning, the electron beam interacts with the unit area IA for a definite period of time and without or with minimally interacting with the surrounding area. During or after scanning, the charges accumulated on the unit area IA and any surrounding area dissipate, which involves the charges being conducted away from the charged region associated with unit area 1A. The distance on the sample required for such conduction is dissipation distance L (FIG. 4B). Distance L is a threshold distance between successively scanned unit areas and is selected to mitigate a charge induced distortion from previously scanned nearby unit area such that a blanked unit area separates the scanned unit area and a next unit area to be scanned by a distance equal to or greater than the threshold distance. Thus, after scanning the unit area 1A, the next unit area to be scanned is located outside of a dissipation region located at or greater than a distance L from the scanned unit area 1A, e.g., the next unit area to be scanned may not be located within the dissipation region circled by dotted line in FIG. 4B. The dissipation region is determined based on the intensity of the electron beam interacting with the unit area 1A and the time duration for such interaction. That is, a greater dissipation region may occur when a higher electron beam intensity is used or when the electron beam interacts with the unit area over a longer time duration, resulting in a stronger electric field and an increased range in which the electric field may have a negative impact.

While it is preferred that the next unit area is located outside of the determined dissipation region to minimize any charge distortion, it is appreciated that some implementations may scan next unit areas that are not adjacent to the previously scanned unit area and that fall within the dissipation region. For example, referring to FIG. 4B, while unit area 7A may have some charge/dissipation effects from the scanning of unit area 1A, the effects may be determined as not being significant enough to cause consequential charge distortion.

Figure 4C:
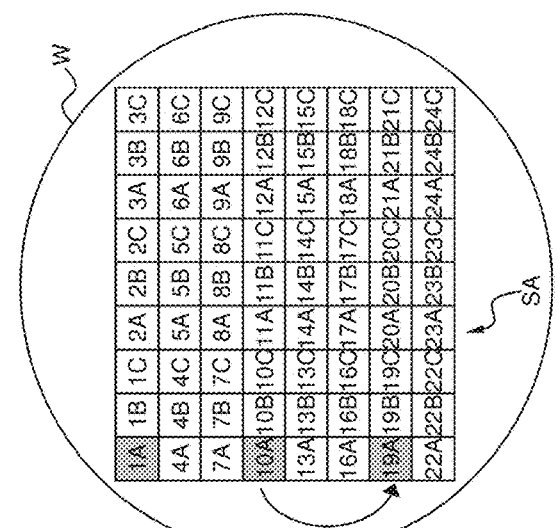

Referring back to the scanning of sample W, the scanning and blanking can occur in organized batches of unit areas. The batch may be a set of unit areas in a row or a column. For example, in the embodiments described in FIGS. 4A-4L, each batch of unit areas corresponds to a different column. As illustrated, in situations where the batch is a column of unit areas, the scanning can start with unit area 1A of a first batch and then down the column, after which unit areas 4A and 7A are blanked using a blanker (e.g., blanker 424 of FIG. 2), so that the electron beam is deflected away from these unit areas. Then, the electron beam tool scans next unit area 10A, which is separated from the scanned unit area 1A by a distance greater than or equal to dissipation distance L. In this manner, after scanning the unit area 10A, the electron beam tool blanks unit areas 13A and 16A (FIG. 4C). Then, in FIG. 4C, the electron beam tool scans unit area 19A. Since unit area 22A is adjacent to the scanned unit area 19A and the distance of separation is less than dissipation distance L, the unit area 22A is blanked by the electron beam tool.

Then, in this way, a first round of scanning and blanking the first batch of unit areas in the first column is finished with some unit areas (i.e., 1A, 10A, and 19A) scanned and some unit areas (4A, 7A, 13A, 16A, and 22A) blanked to allow the charged regions around unit areas 1A, 10A, and 19A to dissipate. After the charge dissipates or substantially dissipates, the dissipation distance could be 0.1 to 5 μm, and the electron beam tool can later revisit the first batch one or more times to scan the blanked unit areas 4A, 7A, 13A, 16A, and 22A so that the imaging information acquired from those unit areas are accurate and is not distorted by the electric field of the accumulated charges.

As shown in FIG. 4D, after scanning unit area 19A, the electron beam tool scans unit area 2A (which can be part of a second batch of unit areas—in this case, the column of unit areas associated with unit area 2A), which is outside of dissipation region associated with scanned unit area 1A. As shown in FIG. 4D, unit areas 1B and 1C are located within dissipation region. Because they are still located in dissipation region, it is appreciated that the columns associated with unit areas 1B and 1C can he blanked or skipped altogether.

Moreover, while FIG. 4D shows that dissipation region is relatively the same size as dissipation region of FIG. 4B, it is appreciated that the size of dissipation region and dissipation distance L may be affected by the elapsed time from the scanning of unit area 1A. Accordingly, the electron beam tool may consider the elapsed time with respect to the dissipation region, when determining which unit area to scan next. To the extent that the dissipation region has been determined to become smaller so that charge has dissipated sufficiently enough from unit area 1C, the electron beam tool can scan unit area 1C and proceed down the column associated with unit area 1C.

Referring back to FIG. 4D, while this figure shows that unit area 2A is the next unit area to be scanned after the scanning of unit area 19A, it is appreciated that any unit area outside of the dissipation regions associated with scanned unit areas 1A, 10A, and 19A can be scanned. For example, unit areas 20A or 23A could be scanned after unit area 19A as they are both outside of the dissipation region associated with unit area 19A. Accordingly, the electron beam tool can blank and scan other unit areas in the column associated with unit areas 20A or 23A.

Figure 4I:
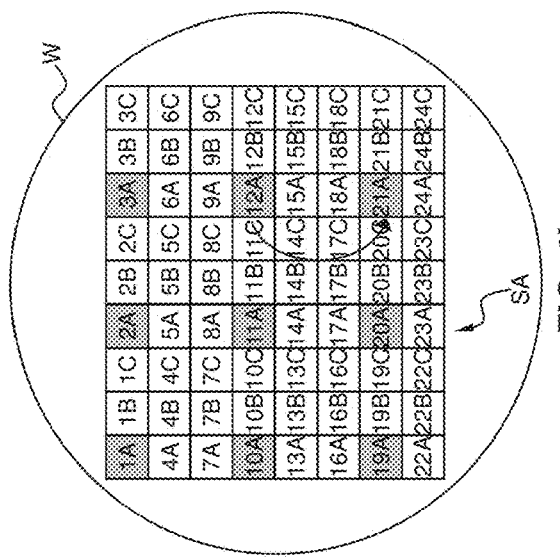
Figure 4H:
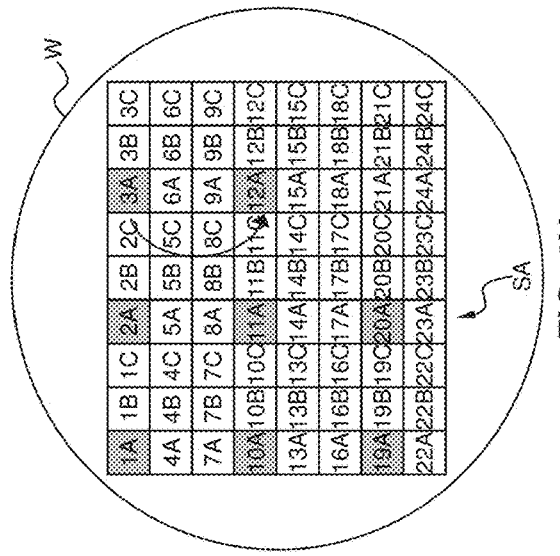
Figure 4G:
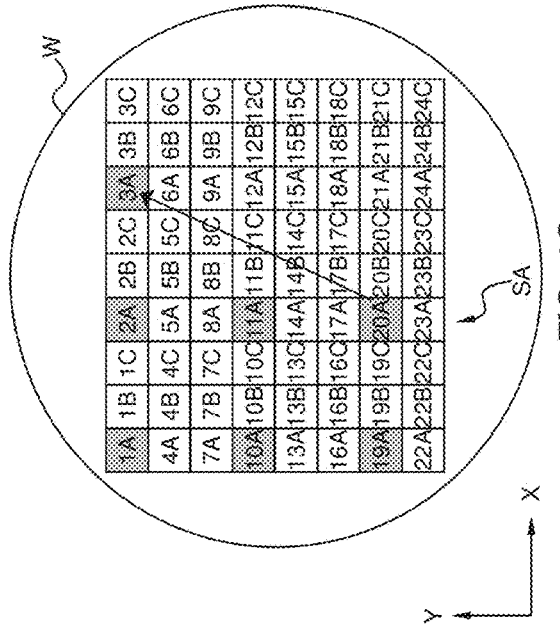

Using the same approach described above in FIG. 4B, in FIG. 4E, after scanning unit area 2A of the second batch, the electron beam tool blanks unit areas 5A and 8A and scans the next unit area 11A. Using the approach described above in FIG. 4C, as shown in FIG. 4F, after scanning unit area 11A, the electron beam tool blanks unit areas 14A and 17A and scans unit area 20A. After scanning unit area 20A, the electron beam tool uses a similar approach described above in FIG. 4D. For example, as shown in FIG. 4G, the unit area 23A is blanked and all the unit areas in columns associated with unit areas 2B and 2C are blanked or skipped, and the electron beam scans unit area 3A of a third batch. In a manner similar to that described earlier, as shown in FIG. 4II, after scanning unit area 3A, the electron beam tool blanks unit areas 6A and 9A and then scans unit area 12A. After scanning unit area 12A, as shown in FIG. 4I, the electron beam tool blanks unit areas 15A and 18A and then scans unit area 21A.

After scanning unit area 21A, unit area 24A and all the unit areas in columns associated with unit areas 3B and 3C are within a range of distance L and may be either blanked or skipped. Then, after scanning unit area 21A, as shown in FIG. 4J, the electron beam tool returns to the first batch of unit areas (in this case, the first column associated with unit area 1A) to scan the un-scanned unit area 4A, which is adjacent to previously scanned first unit area 1A as the charge from unit area 1A has dissipated enough over time to mitigate any threshold level of charge distortion for imaging unit area 4A.

Figure 4L:
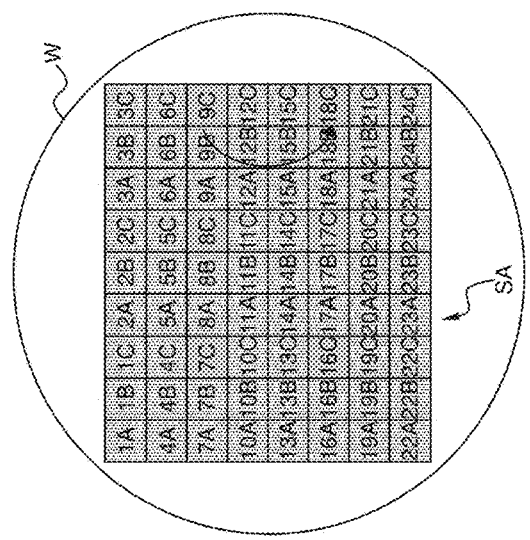
Figure 4K:
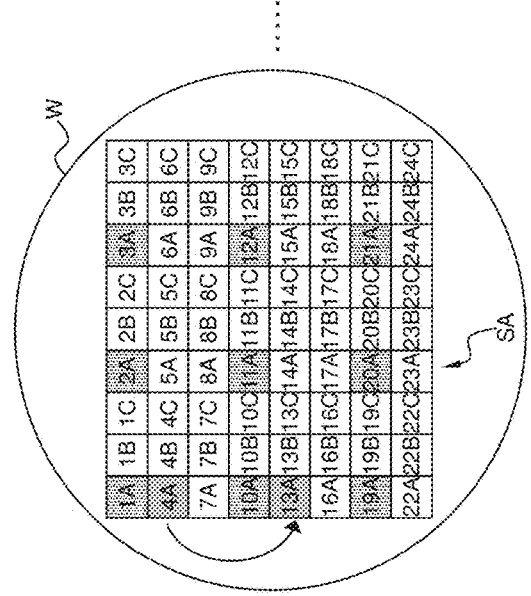
Figure 4J:
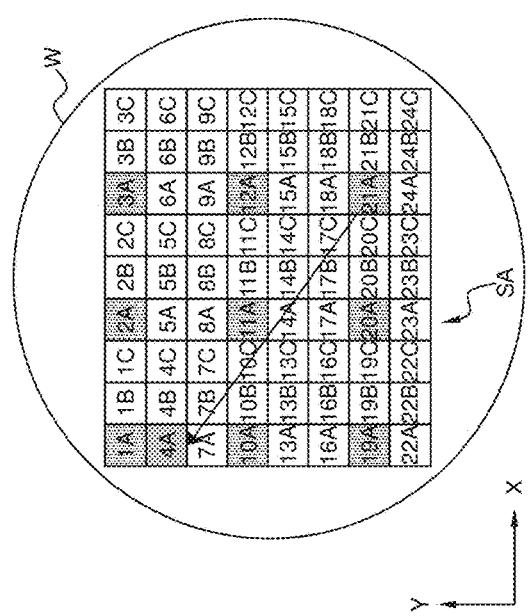

For the similar reason explained above, as shown in FIG. 4K after scanning unit area 4A in FIG. 4J, the electron beam tool blanks unit areas 7A and 10A, and the electron beam scans unit area 13A (FIG. 4K). This process continues, such that unit area 22A is scanned, after which the electron beam tool scans unit areas 5A, 14A, and 23A of the second batch and unit areas 6A, 15A, and 24A of the third batch in order. Then, the electron beam tool can move back to the first column of unit areas and scan unit areas 7A and 16A of the first batch, after which the electron beam tool scans unit areas 8A and 17A of the second batch and unit areas 9A and 18A of the third batch. Upon completing the scanning of the A-columns associated with unit areas 1A, 2A, and 3A, the scanning and blanking process can move to scan the B-columns (e.g., columns associated with unit areas 1B, 2B, and 3B) in a manner similar to that described above with respect to FIGS. 4A-4K. After the unit—areas in the B-columns are scanned, the electron beam tool can then move to scan and blank the C-columns (e.g., columns associated with unit areas 1C, 2C, and 3C), the completion of which is shown in FIG. 4L. In this way, the entire scanning area or grid SA is scanned. After completing the scanning, the information obtained are analyzed by the processor or controller of the SEM system with or without intervention of a user using the user interface 109 in FIG. 1.

FIGS. 5A, 5B, and 5C are schematic diagrams illustrating top plan views of the reference sample of FIG. 3 undergoing different stages of scanning by the exemplary electron beam tool of FIG. 2 by column-to-row scanning at a different dissipation distance L' (i.e. L'≠ L), consistent with some embodiments of the present disclosure. Distance L' is a distance greater than a threshold distance between successively scanned unit areas is selected to mitigate a charge induced distortion from previously scanned nearby unit area such that the blanked unit area separates the scanned said each unit area and a next unit area to be scanned by a distance greater than the threshold distance. In FIG. 5A, during scanning the sample W, the electron beam tool emits an electron beam, which interacts with the first unit area 1A of the scanning area or grid SA. During this scanning, the electron beam interacts with most of the unit area 1A or the entire unit area 1A for a definite period of time. During or after scanning, the charges accumulated on the unit area 1A begin to dissipate by being conducted away from the unit area of the sample W. The distance on the sample required for such conduction is dissipation distance L' (FIG. 5B). Thus, after scanning the unit area 1A, the next unit area to be scanned may he located at or outside of distance L' from the scanned unit area 1A, that is, the next unit area to be scanned may not be located within the dissipation region annotated by dotted line in FIG. 5B.

As shown in FIG. 5B, after scanning unit area 1A, the electron beam tool blanks unit areas 4A, 7A, and 10A, by deflecting the electron beam away from these unit areas as each of these blanked unit areas fall within dissipation region of the dashed circle associated with dissipation distance L'. Then, the electron beam scans the next unit area 16A, which is separated from the scanned unit area 1A by dissipation distance L'. In this manner, after scanning the unit area 16A, the unit areas 19A and 22A are blanked and all unit areas of columns 2 to 5 are either blanked or skipped (FIG. 5C).

Then, the electron beam scans the next unit area 2C. After scanning unit area 2C, the electron beam tool blanks unit areas 5C, 8C, 11C, and 14C and scans unit area 17C (FIG. 5C). After scanning unit area 17C, unit areas 20C 23C are blanked and all unit areas in columns 7 to 9 are all within a range of distance L' and can be blanked or skipped, in which they can be scanned later. Then, the electron beam returns to the first column to continue to scan the next unit area (e.g., unit area 4A). In this way, the first round of scanning the scanning area is completed by scanning unit areas IA, 16A, 2C, and 17C.

Figure 6A:
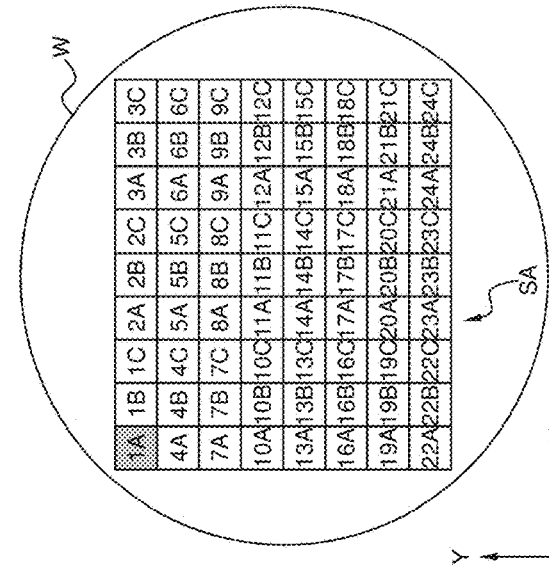
FIGS. 6A-6I are schematic diagrams illustrating top plan views of the reference sample of FIG. 3 undergoing another exemplary scanning process performed by the exemplary electron beam tool of FIG. 2, consistent with some embodiments of the present disclosure.

FIGS. 6A-6I, are schematic diagrams illustrating top plan views of the reference sample of FIG. 3 undergoing different stages of scanning by the exemplary electron beam tool of FIG. 2 by diagonal scanning at dissipation distance L, consistent with some embodiments of the present disclosure. In FIG. 6A, during scanning of the sample W, the electron beam tool emits an electron beam that interacts with the first unit area 1A of the scanning area or grid SA. During this scanning, the electron beam interacts with most of the unit area 1A or the entire unit area 1A for a definite period of time.

Figure 6B:
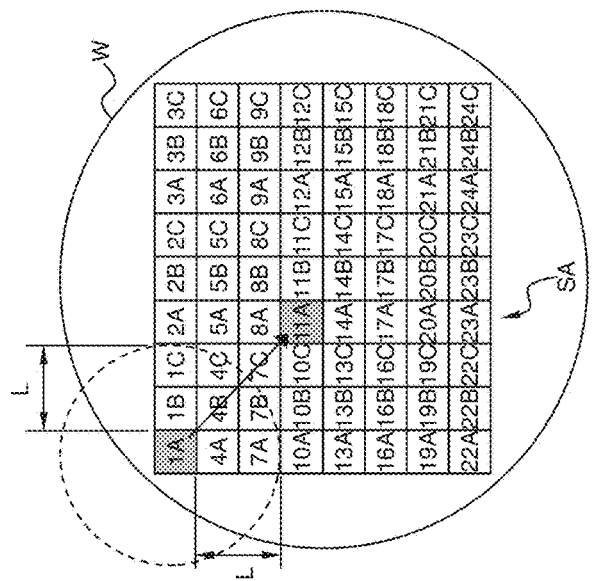
Figure 6C:
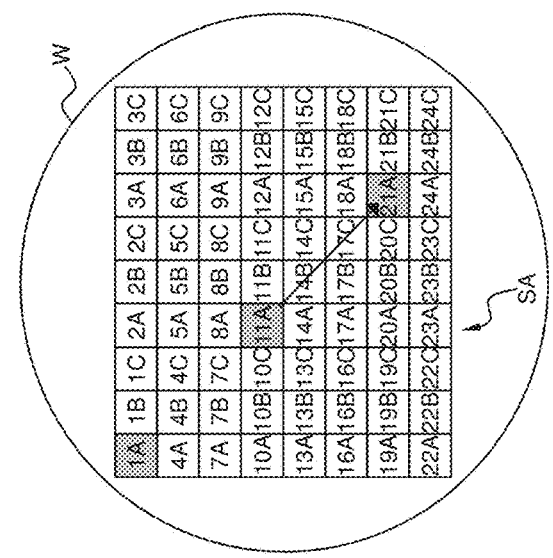

During or after scanning, the charges accumulated on the unit area 1A begin dissipating by being conducted away from the unit area of the sample W. The distance on the sample required for such conduction is dissipation distance L (FIG. 6B). Thus, after scanning the unit area 1A, the electron beam tool scans unit area 11A, which is located outside of dissipation region. In a scanning fashion of starting from unit area 1A and then diagonally to the bottom right corner of the grid SA, unit areas 4B and 7C are entirely or partially within the range of distance L from unit area 1A and are blanked by a blanker (e.g., blanker 424 of FIG. 2). Then, the electron beam scans the next unit area 11A, which is separated from the scanned unit area 1A by more than dissipation distance L. In this manner, after scanning the unit area 11A, the electron beam tool blanks the unit areas 14B and 17C (FIG. 6C). Then, the electron beam scans the next unit area 21A. After scanning unit area 21A, the electron beam tool blanks unit area 24B and then scans unit area 2A (FIG. 6D). It is appreciated that between the blanking of unit area 24B and the scanning of unit area 2A, the electron beam tool can blank unit areas 1B, 4C, 8A, 11B, 14C, 18A, 2113, 24C, 1C, 5A, 8B, 11C, 15A, 18B, and 21C.

After scanning unit area 2A, the electron beam tool blanks at least unit areas 5B and 8C as these unit areas' fall within the range of distance L from unit area 2A. Then, the electron beam scans unit area 12A (FIG. 6E). After the scanning of unit area 12A, the electron beam tool can blank unit areas 2B, 5C, 9A, 12B, 15C, 2C, 6A, 9B, and 12C or skip them altogether and proceed to the next unit area to scan.

Figure 6F:
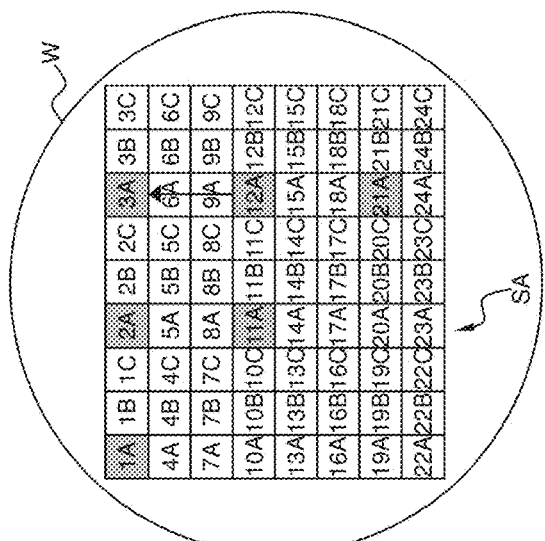
Figure 6E:
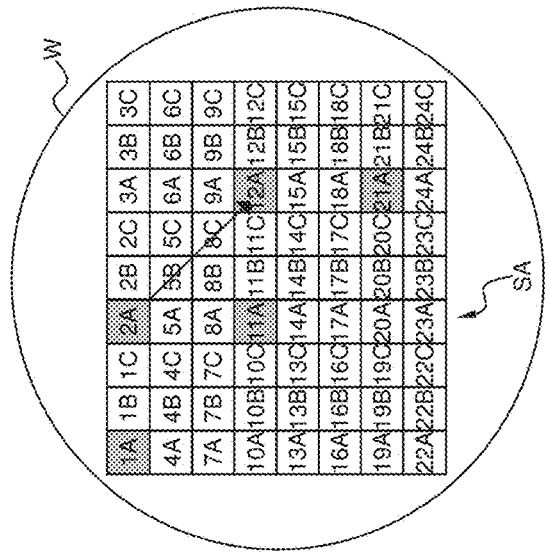
Figure 6D:
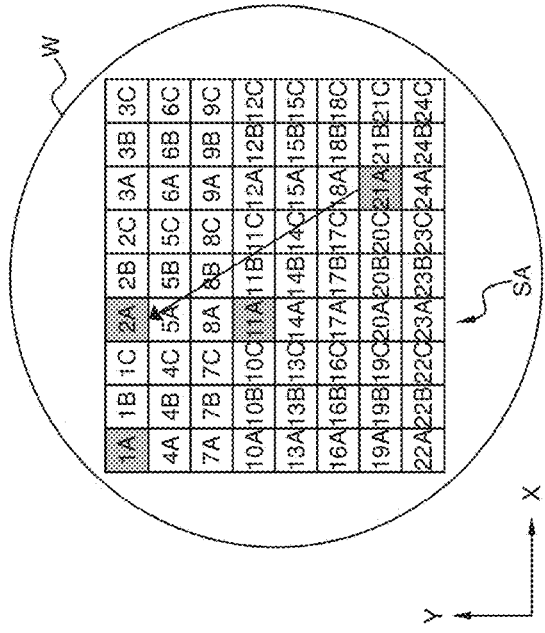
Figure 6G:
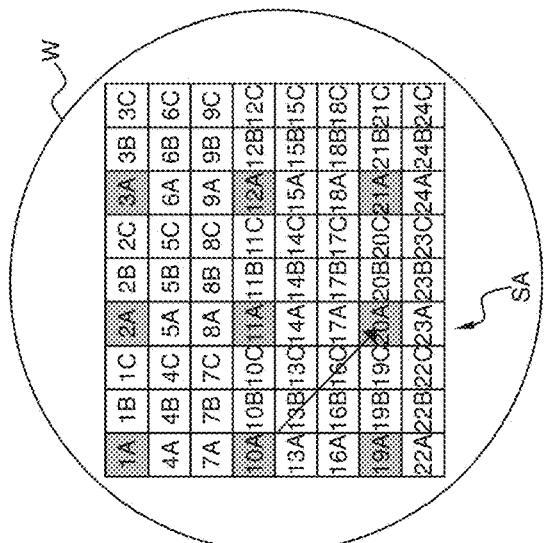

Then, the electron beam scans unit area 3A (FIG. 6F). In FIG. 6G, after scanning unit area 3A, the electron beam tool scans one of unit area 19A (FIG. 6G). It is appreciated that the electron beam tool can scan unit area 10A instead of unit 19A and then blank one or more unit areas that are diagonal from unit 10A.

Figure 6H:
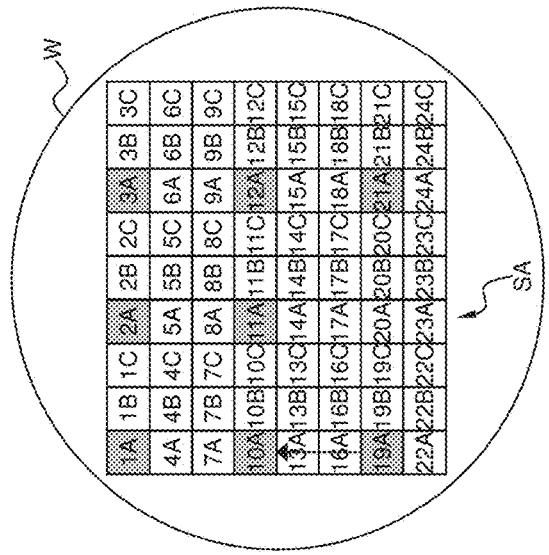
Figure 6I:
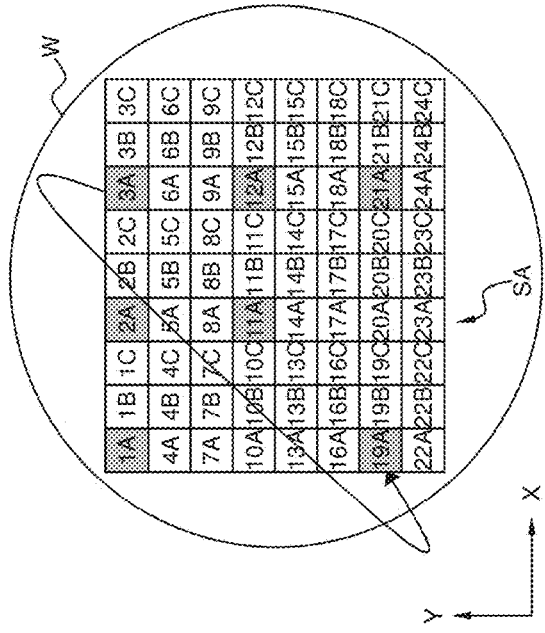

Referring to FIG. 6H, after scanning unit area 19A, the electron beam tool can blank unit areas 22B, 16A, 19B, 22C, 13A, 16B, I9C, and 23A because these unit areas are within the range of distance L and scanning these unit areas would result in distorted information. It is appreciated that instead of blanking these unit areas (i.e., unit areas 22B, 16A, 19B, 22C, 13A, 16B, 19C, and 23A), the electron beam tool can skip the units altogether before moving to scan the next unit area. Then, the electron beam tool scans unit area 10A (FIG. 6H). In the same manner as FIG. 6E, the electron beam tool blanks at least unit areas 13B and 16C before scanning at unit area 20A (FIG. 6I). Thus, in the completion of the first round of scanning the scanning area SA, unit areas 1A, 10A, 19A, 2A, 11A, 20A, 3A, 12A, and 21A are scanned while all other unit areas in the scanning area or grid SA are blanked (while some of the unit areas may be skipped altogether). The above embodiments show a rectangular grid. To one of ordinary skill in the art, the grid shape can be any shape including square, pentagon, hexagon, polygon, circle, ellipse, and a mixture of different shapes.

As described above, the plurality of unit areas of a scanning area can be organized in batches of unit areas provided in rows or columns, and the scanned unit area and the blanked unit area are in a first batch of unit areas. After scanning and blanking unit areas in the first batch, the electron beam tool blanks a second batch of unit areas that is adjacent to the first batch; and the electron beam tool scans and blanks unit areas in a third batch of unit areas that is not adjacent to the first batch and is at least a threshold distance from the first batch to mitigate charge induced distortion from scanned unit areas of the first batch. After scanning and blanking unit areas in the third hatch or after a dissipation time threshold, the electron beam tool returns to the first batch of unit areas to scan unit areas that have not been previously scanned to mitigate charge induced distortion from previously scanned unit areas of the first batch. In this way, the unit areas to be scanned and blanked can be flexibly controlled to suit different purposes (e.g. efficiency of scanning or time consumption, and image quality levels of the final image).

Alternately, the method includes scanning a first set of locations with the SEM. Each location of the first set of locations being physically separated by at least a threshold distance. The method further includes scanning a second set of locations with the SEM a period of time after scanning the first set of locations, in some embodiments. A location of the second set of locations is located within the threshold distance of a location of the first set of locations, in some embodiments. The period of time enables charge resulting from the scanning the first set of locations to dissipate sufficiently so as to mitigate a charge induced distortion of a scan of a location within the threshold distance. In some embodiments, each of the first set of locations are arranged in diagonal to each other. In some embodiments, each of the second set of locations are arranged in diagonal to each other.

Figure 7:
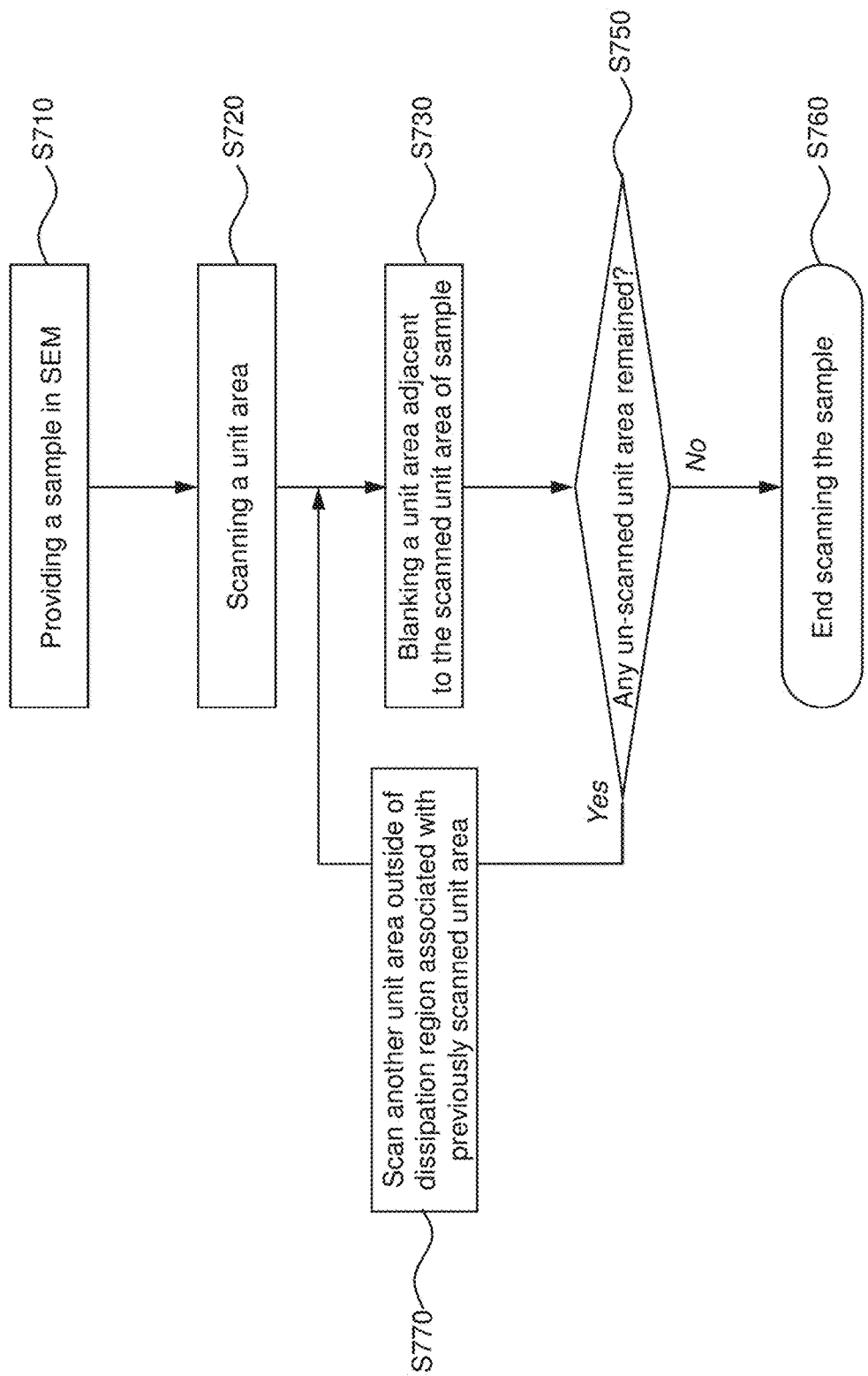
FIG. 7 is a flow chart illustrating an exemplary method of scanning and blanking a sample using a SEM, consistent with some embodiments of the present disclosure.

References are now made to FIG. 7 which is a flow chart illustrating an exemplary method of scanning a sample using a charged particle tool, consistent with some embodiments of the present disclosure. The method may be performed by a charged particle beam tool, such as an electron beam tool (e.g., electron beam tool 104 of FIG. 2).

In step S710, a sample is provided in the electron beam tool. The sample (e.g., sample 403 of FIG. 2 or sample W of FIG. 3) includes a wafer made of silicon, silicon dioxide, germanium, and silicon germanium, with or without a pattern formed on it by any method including UV, DUV, and EUV photolithographic methods, among others. The sample may include regions having conducting, semiconducting, or insulating properties. Also, the sample may be processed by sputtering on it a layer of highly conductive material such as gold or silver or may not be processed.

Under the electron beam tool, the top surface of sample can be logically divided into numerous unit areas, such as pixels (e.g., as illustrated in FIG. 3). Each of the unit areas is scanned by an electron beam of the electron-beam tool for a short period of time. In this example, the unit area or pixel is a 1 nm by 1 nm square region of the sample, but it is appreciated that the unit area may be a defined region of any size or any shape including rectangular, circular, or polygonal shape, among others.

In step S720, the electron beam tool scans one or more unit areas of the sample. During the scanning, the electron beam interacts with the material on the surface of the unit area of the sample. The more time that the electron beam interacts with the unit area, the more that charge buildup occurs at a region surrounding the unit area from that interaction. Optionally, in step S720, a time stamp associated with the scanning of the unit area can be provided, which may allow the electron beam tool to determine when to revisit the unit areas surrounding the scanned unit area in order to minimize the impact that the charge distortion from the previously scanned unit area may have on the surrounding unit areas.

The more charge buildup that occurs in the region surrounding the unit area, the longer it may take for the charge to dissipate from the region. Moreover, the type of sample material can affect the charge dissipation, as each type of sample material can have distance- and time-dissipation characteristics. These characteristics can vary based on the materials used. In some examples, the distance for conducting the accumulated charges away from the scanned unit area of the sample is about 0.1-5 µm and is called dissipation distance, and the time required for such effect is called dissipation time.

In step S730, the electron beam tool blanks a unit area adjacent to the scanned unit area of sample. Considering the dissipation distance and dissipation time required for conducting the accumulated charges away from the scanned unit area of the sample, the next region to be scanned would be located at a distance equal to or greater than the dissipation distance from the scanned unit area in step S720. To achieve the effect of not scanning the region between the scanned unit area in step S720 and the next unit area to be scanned, the electron beam tool is equipped with a component called a blanker (e.g., blanker 424 of FIG. 2). The blanker may be a shutter, electromagnetic field deflector, or pure electrostatic deflector, among others. The blanker can deflect the electron beam such that the electron beam no longer reaches the sample so that the region between the scanned unit area in step S720 and the unit area to be scanned is not scanned by the electron beam.

As described above, it is appreciated that more than one unit area may be blanked (e.g., unit areas 4A and 7A after unit area 1A has been scanned in FIG. 4B). The number of blanked unit areas may depend on the amount of time that the electron beam interacts with the scanned unit area of step S720. The amount of time can affect the dissipation time and the dissipation distance, both of which can used to determine the blanking time and corresponding one or more blanking unit areas, respectively. That is, the time for blanking is determined by the dissipation time and the unit area for blanking is determined by the dissipation distance such that blanked distance is greater than the dissipation distance and the time for blanking is greater than the dissipation time.

At step S750, the electron beam tool determines whether there are any un-scanned unit areas in the sample. If, after the step S730 of blanking a unit area, there is un-scanned unit area, the method proceeds to S770, in which the electron beam tool scans another unit area outside of the dissipation region associated with the previously scanned unit area (e.g., unit area scanned in step S720). In this way, the scanning and blanking of unit areas can be repeated until the interested region of the sample is entirely scanned, at which point at step S750, the electron beam tool determines that there are no remaining un-scanned areas. Then, the process of scanning the sample ends at step S760.

Optionally, after step S750, the method further includes a process of providing an image of the sample by reconstructing the entire image using the sub-images generated using the various scanned unit area. To do so, the sequence of images may be mapped to the logical arrangement of the numerous unit areas and the order by which the numerous unit areas are scanned. For example, using FIGS. 4A-4J as a reference, the first sub-image (sub-image associated with unit area 1A) can be stitched together with the tenth sub-image (sub-image associated with unit area 4A) using the scanning order of the unit areas as a reference. Also, the reconstructing is performed by using at least one of interpolation, sparse sampling or simulation.

The embodiments may further be described using the following clauses:

1. A method for scanning a sample by a charged particle beam tool, comprising:
   providing the sample having a scanning area, wherein the sample is determined to have a plurality of unit areas;
   scanning a unit area of the plurality of unit areas; and
   blanking a first unit area adjacent to the scanned unit area.

2. The method of clause 1, further comprising:
   determining whether any unit area on the sample remains to be scanned;
   in response to the determination that any unit area on the sample remains to be scanned,
   scanning a next unit area that is more than a predetermined distance from the scanned unit area; and
   blanking a second unit area adjacent to the scanned next unit area.

3. The method of clause 2, wherein the predetermined distance is based on a dissipation region associated with the scanned unit area.

4. The method of clause 2, further comprising blanking a third unit area adjacent to the blanked first unit area before scanning the next unit area.

5. The method of clause 1, wherein the blanked first unit area includes multiple unit areas.
6. The method of any one of clauses 1 to 5, wherein the first blanked unit area is adjacent to the scanned unit area in an X-direction.
7. The method of any one of clauses 1 to 5, wherein the first blanked unit area is adjacent to the scanned unit area in a Y-direction.
8. The method of clause 1, wherein the scanned unit area is a single pixel of a scanned image.
9. The method of clause 1, wherein the first blanked unit area is a single pixel.
10. The method of clause 1, wherein the first blanked unit area is multiple pixels.
11. The method of clause 1, wherein the scanned unit area is a plurality of pixels of a scanned image.
12. The method of any one of clauses 1 to 11, wherein blanking a first unit area adjacent to the scanned unit area further comprises:
applying a current to an electromagnetic blanker so that an electromagnetic field generated by the blanker deflects a charged-particle beam of the charged-particle beam tool such that the charged-particle beam no longer reaches the sample.
13. The method of any one of clauses 1 to 11, wherein blanking a first unit area adjacent to the scanned unit area further comprises:
moving a shutter to intercept a pathway of a charged-particle beam of the charged-particle beam tool such that the charged-particle beam no longer reaches the sample.
14. The method of any one of clauses 1 to 13, wherein the scanning and the blanking are determined based on a dissipation time for charge dissipation in the scanned unit area.
15. The method of any one of clauses 1 to 13, wherein the scanning and the blanking are carried out on a predetermined pattern in the sample.
16. The method of clause 15, wherein the predetermined pattern is one of a line pattern parallel to the edges of the scanning area, a line pattern diagonal in the scanning area, or a circular pattern.
17. The method of any one of clauses 1 to 15, wherein the scanning and the blanking are performed on the plurality of unit areas until all unit areas are scanned.
18. The method of clause 17, further comprising reconstructing an image of the sample using sub-images corresponding to the plurality of unit areas that have been scanned.
19. The method of clause 18, wherein the reconstructing is performed by using at least one of interpolation, sparse sampling, or simulation.
20. The method of any of one of clauses 1 to 19, wherein the plurality of unit areas of a scanning area are organized in batches of unit areas provided in rows or columns and wherein the scanned unit area and the blanked unit area are in a first batch of unit areas.
21. The method of clause 20, wherein after scanning and blanking unit areas in the first batch:
blanking or skipping a second batch of unit areas that is adjacent to the first batch; and
scanning and blanking unit areas in a third batch of unit areas that is at least a threshold distance from the first hatch to mitigate charge induced distortion from scanned unit areas of the first batch.
22. The method of clause 20, further comprising after a dissipation time threshold, returning to the first batch of unit areas to scan unit areas that have not been previously scanned to mitigate charge induced distortion from previously scanned unit areas of the first batch.
23. A charged particle beam system comprising:
a charged particle source;
a scanning deflector to scan a charged particle beam emitted from the charged particle source on a scanning area of a sample, wherein the sample is determined to have a plurality of unit areas;
a blanker for blanking the charged particle beam such that the charged particle beam no longer reaches the sample; and
a controller includes circuitry for controlling the scanning deflector and the blanker,
wherein the controller is configured to:
scan a unit area of the plurality of unit areas; and
blank a first unit area adjacent to the scanned unit area.
24. The system of clause 23, wherein the controller is further configured to:
determine whether any unit area on the sample remains to be scanned;
in response to the determination that any unit area on the sample remains to be scanned,
scan a next unit area that is more than a predetermined distance from the scanned unit area; and
blank a second unit area adjacent to the scanned next unit area.
25. The system of clause 24, wherein the predetermined distance is based on a dissipation region associated with the scanned unit area.
26. The system of any one of clauses 24 and 25, wherein the controller is further configured to:
blank a third unit area adjacent to the blanked first unit area before scanning the next unit area.
27. The system of clause 23, wherein the blanked first unit area includes multiple unit areas.
28. The system of any one of clauses 23 to 27, wherein the charged particle beam system is a scanning electron microscope (SEM).
29. The system of any one of clauses 23 to 28, wherein the charged particle beam is an electron beam.
30. The system of clauses 23 to 29, wherein the first blanked unit area is adjacent to the scanned unit area in an X-direction.
31. The system of clauses 23 to 29, wherein the first blanked unit area is adjacent to the scanned unit area in a Y-direction.
32. The system of clause 23, wherein the scanned unit area is a single pixel of a scanned image.
33. The system of clause 23, wherein the first blanked unit area is a single pixel.
34. The system of clause 23, wherein the first blanked unit area is multiple pixels.
35. The system of clause 23, wherein the scanned unit area is a plurality of pixels of a scanned image.
36. The system of any one of clauses 23 to 35, wherein the blanker is an electromagnetic blanker to which a current is applied so as to induce an electromagnetic field that deflects the charged particle beam of the SEM such that the charged particle beam no longer reaches the sample.
37. The system of any one of clauses 23 to 35, wherein the blanker is a shutter configured to intercept a pathway of the charged particle beam of the SEM so as to perform the blanking.
38. The system of any one of clauses 23 to 37, wherein the blanker is configured to blank for a time determined based on a dissipation time for charge dissipation.

39. The system of any one of clauses 23 to 37, wherein the controller includes circuitry to determine a next unit area to scan, wherein the next unit area is at least a threshold distance from the scanned unit area and is selected to mitigate a charge induced distortion from the scanned unit area such that the blanked unit area separates the scanned unit area from the next unit area.

40. The system of any one of clauses 23 to 39, wherein the blanker is configured to blank a predetermined pattern in the sample comprising any one of a line pattern parallel to edges of the scanning area, a line pattern diagonal in the scanning area to a direction, a circular pattern, or a random pattern.

41. The system of any one of clauses 23 to 40, wherein the blanker is positioned between the charged particle source and the scanning deflector.

42. A non-transitory computer readable medium that stores a set of instructions that is executable by at least one processor of a computer system to cause the computer system to perform a method for service processing, the method comprising:
   providing a sample having a scanning area, wherein the sample is determined to have a plurality of unit areas;
   scanning a unit area of the plurality of unit areas with a charged particle beam; and blanking a unit area adjacent to the scanned unit area.

43. The non-transitory computer readable medium according to clause 42, wherein the set of instructions that is executable by the at least one processor of a computer system to cause the computer system to further perform:
   determining whether any unit area on the sample remains to be scanned;
   in response to the determination that any unit area on the sample remains to be scanned,
      scanning with the charged particle beam a next unit area that is more than a predetermined distance from the scanned unit area; and
      blanking a unit area adjacent to the next unit area.

44. The non-transitory computer readable medium according to clause 43, wherein the predetermined distance is based on a dissipation region associated with the scanned unit area.

45. The non-transitory computer readable medium according to clauses 42 to 44, wherein the scanned unit area is a single pixel or a plurality of pixels of a scanned image before a next unit area is scanned.

46. A method of scanning a sample by a charged particle beam system, the method comprising:
   scanning a first unit area of a first set of unit areas with a charged particle beam, each unit area of the first set of unit areas being separated by more than a predetermined distance; and
   scanning a second unit area of a second set of unit areas a period of time after scanning the first unit area of the first set of unit areas, each unit area of the second set of unit areas being separated by more than the predetermined distance.

47. The method of clause 46, wherein the predetermined distance is based on a size of a dissipation region associated with a unit area.

48. The method of any one of clauses 46 to 47, wherein the period of time is based on a time to dissipate charge that results from the scanning of the first unit area.

It is appreciated that a controller of the electron beam tool could use software to control the functionality described above. For example, the controller may assist with the scanning and blanking of unit areas and the order by which the unit areas are scanned. Moreover, the controller can automatically adjust the order by which the unit areas are scanned and blanked based on the characteristics of the wafer and the length of time the electron beam interacts with the wafer. The controller may send instructions for scanning the wafer (such as scanning a wafer of FIG. 7). The software may be stored on a non-transitory computer readable medium. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, cloud storage, a FLASH-EPROM or any other flash memory, NVRAM, a cache, a register, any other memory chip or cartridge, and networked versions of the same.

It will be further understood that various changes in the details, materials, and arrangements of the parts which have been described and illustrated in order to explain the nature of described embodiments may be made by those skilled in the art without departing from the scope as expressed in the following claims.

The invention claimed is:

1. A non-transitory computer readable medium that stores a set of instructions that is executable by at least one processor of a computer system to cause the computer system to perform a method comprising:
   providing a sample having a scanning area, wherein the sample is determined to have a plurality of unit areas;
   scanning a unit area of the plurality of unit areas with a scanning charged-particle beam;
   blanking a first unit area adjacent to the scanned unit area, wherein blanking the first unit area comprises deflecting a charged-particle beam of a charged-particle beam tool such that the deflected charged-particle beam no longer reaches the sample.

2. The non-transitory computer readable medium of claim 1, wherein the set of instructions is executable by the at least one processor to cause the computer system to further perform deflecting the charged-particle beam by an electromagnetic field generated by applying a current to a blanker.

3. The non-transitory computer readable medium of claim 1, wherein the set of instructions is executable by the at least one processor to cause the computer system to further perform blanking the first unit area by moving a shutter to intercept a pathway of the charged-particle beam of the charged-particle beam tool such that the charged-particle beam no longer reaches the sample.

4. The non-transitory computer readable medium of claim 1, wherein the set of instructions is executable by the at least one processor to cause the computer system to further perform:
   determining whether any unit area on the sample remains to be scanned; and
   in response to the determination that any unit area on the sample remains to be scanned,
      scanning a next unit area that is more than a predetermined distance from the scanned unit area; and
      blanking a second unit area adjacent to the scanned next unit area.

5. The non-transitory computer readable medium of claim 4, wherein the predetermined distance is based on a dissipation region associated with the scanned unit area.

6. The non-transitory computer readable medium of claim 1, wherein the set of instructions is executable by the at least one processor to cause the computer system to further perform blanking a third unit area adjacent to the blanked first unit area before scanning the next unit area.

7. The non-transitory computer readable medium of claim 1, wherein the set of instructions is executable by the at least one processor to cause the computer system to further perform scanning and blanking on a predetermined pattern in the sample, wherein the predetermined pattern comprises a line pattern parallel to the edges of the scanning area, a line pattern diagonal in the scanning area, or a circular pattern.

8. The non-transitory computer readable medium of claim 1, wherein the set of instructions is executable by the at least one processor to cause the computer system to further perform scanning and blanking on each of the plurality of unit areas until all unit areas are scanned.

9. The non-transitory computer readable medium of claim 8, wherein the set of instructions is executable by the at least one processor to cause the computer system to further perform reconstructing an image of the sample using sub-images corresponding to the scanned plurality of unit areas, wherein the reconstructing is performed by using at least one of interpolation, sparse sampling, or simulation.

10. The non-transitory computer readable medium of claim 1, wherein the set of instructions is executable by the at least one processor to cause the computer system to further perform organizing the plurality of unit areas in batches of unit areas provided in rows or columns and wherein the scanned unit area and the blanked first unit area are in a first batch of unit areas.

11. The non-transitory computer readable medium of claim 10, wherein the set of instructions is executable by the at least one processor to cause the computer system to further perform, after scanning and blanking unit areas in the first batch:

blanking or skipping a second batch of unit areas adjacent to the first batch; and scanning and blanking unit areas in a third batch of unit areas that is at least a threshold distance from the first batch to mitigate charge induced distortion from scanned unit areas of the first batch.

12. The non-transitory computer readable medium of claim 10, wherein the set of instructions is executable by the at least one processor to cause the computer system to further perform returning to the first batch of unit areas, after a dissipation time threshold, to scan unit areas that have not been previously scanned to mitigate charge induced distortion from previously scanned unit areas of the first batch.

13. The non-transitory computer readable medium of claim 1, wherein the first blanked unit area is adjacent to the scanned unit area in an X-direction.

14. The non-transitory computer readable medium of claim 1, wherein the first blanked unit area is adjacent to the scanned unit area in a Y-direction.

15. The non-transitory computer readable medium of claim 1, wherein the first blanked unit area comprises a single pixel.

16. The non-transitory computer readable medium of claim 1, wherein the first blanked unit area comprises multiple pixels.

17. The non-transitory computer readable medium of claim 1, wherein the scanned unit area comprises a single pixel of a scanned image.

18. The non-transitory computer readable medium of claim 1, wherein the scanned unit area comprises a plurality of pixels of a scanned image.

* * * * *